United States Patent [19]

Sadoway et al.

[11] Patent Number: 5,166,131
[45] Date of Patent: Nov. 24, 1992

[54] METHODS FOR PROCESSING SUPERCONDUCTING MATERIALS

[75] Inventors: Donald R. Sadoway, Belmont; Robert M. Rose, Wenham, both of Mass.

[73] Assignee: Massachusetts Institute of Technology, Cambridge, Mass.

[21] Appl. No.: 280,018

[22] Filed: Dec. 5, 1988

[51] Int. Cl.$^5$ .................... H01L 39/12; C01B 13/10; C01F 17/00
[52] U.S. Cl. .................... 505/1; 505/742; 423/263; 423/593; 204/176
[58] Field of Search .................... 505/1, 737, 742, 779, 505/780, 785; 423/263, 265, 593, 604; 502/355; 501/152, 123; 252/521; 204/176

[56] References Cited

FOREIGN PATENT DOCUMENTS 0261769 10/1988 Japan .................... 505/1
0297203 12/1988 Japan .................... 505/1

OTHER PUBLICATIONS

"Effect of Oxidizing Atmosphere on Superconductivity in $RBa_2Cu_{3-x}M_xO_2$" Robinson et al., Mat. Res. Soc. Symp. Proc. vol. 99, 1988, pp. 587–590.

"Improved High-$T_c$ Superconductors", Bhargava et al., Phys. Rev. Lett., Sep. 28, 1987, pp. 1468–1471, vol. 59, No. 13.

"Effects of Surface Treatments on $Ba_2YCu_3O_{7-y}$ Thin Films", Tamara et al., Mat. Res. Soc. Symp. Sup., Apr., 1988, pp. 117–120.

"Thermal Stability of Superconducting $YBa_2Cu_3O_{9-x}$ in Different Environments", Swaminathan et al., Materials Letters, May, 1988, pp. 261–264, vol. 6, No. 8-9.

"Growth of $YBa_2Cu_3O_x$ single crystals", Kaiser et al., Appl. Phys. Lett. (51) No. 13, Sep. 28, 1987, pp. 1040–1042.

"Synthesis of Y–Ba–Cu–O Superconductors from $Y_2O_3BaO_2$, and $Cu_2O$: The Optional Oxygen Treatment", Kao, Mat. Lett., vol. 6, No. 3, Dec., 1987, pp. 53–57.

"Atmospheric Effects During Thermal Cycling of $Ba_2YCu_3O_{7\pm x}$ Superconductors", North–Holland Physics Pub., Jul., 1987, Shelby et al., pp. 420–424.

"Production of Superconducting $Y_1Ba_2Cu_3O_x$ Thin Films By D.C. Diode Sputtering and Annealing", Bullock et al., Amer. Inst. of Phys. Conf. No. 165, Nov., 1987, pp. 71–78.

Primary Examiner—Michael Lewis
Assistant Examiner—Steven Bos
Attorney, Agent, or Firm—Choate, Hall & Stewart

[57] ABSTRACT

A superconducting oxide is exposed to ozone. In one embodiment, the oxide is cooled to the superconducting state before exposure to ozone. The oxide may also be thermally cycled into and out of the superconducting state before exposure to ozone. The ozone may be in either the liquid or gaseous state and may be mixed with molecular oxygen. After exposure to ozone, the critical, or transition, temperature is elevated in comparison with material not so processed.

16 Claims, No Drawings

METHODS FOR PROCESSING SUPERCONDUCTING MATERIALS

BACKGROUND OF THE INVENTION

This invention relates to methods for processing superconducting materials to enhance their superconducting properties such as, for example, to elevate their critical temperature, and the resulting materials.

Superconducting perovskites such as barium yttrium cuprate, barium ytterbium cuprate and other now well known species in which the Y or Yb are replaced by other rare earth elements such as La, Eu, Gd, Tb, Dy, Ho, Er, Tm, and Lu and the Ba is completely or partially replaced by Sr or Ca, exhibit a transition to the superconducting state at approximately 90 Kelvins. Other superconductors are known in the Bi-Sr-Ca-Cu-O and Tl-Ba-Ca-Cu-O systems. Materials with higher transitions will expand greatly the uses for superconducting materials.

SUMMARY OF THE INVENTION

The method according to one aspect of the invention for elevating the critical temperature of a superconducting oxide involves exposing the oxide to ozone. In one embodiment, the oxide is cooled to the superconducting state before exposure to ozone. In another embodiment, the oxide is thermally cycled into and out of the superconducting state before exposure to the ozone. The ozone may be in either the liquid or the gaseous state and may be supplied as a mixture with oxygen. Electrical current may also be driven through the oxide during exposure to the ozone. After processing according to the invention the superconducting materials exhibit a higher critical temperature. The invention is applicable to all superconducting oxides whether made from oxides of the constituent metals or by oxidizing an alloy of the metallic precursors or made in any other way. The process is also applicable to the metallic alloy precursors themselves, both oxidation to the superconducting oxide and elevation of critical temperature occurring during processing according to the invention.

DESCRIPTION OF THE PREFERRED EMBODIMENT

EXAMPLES

In these examples, the starting material was barium yttrium cuprate, or barium ytterbium cuprate. The yttrium materials had been processed in the following manner. A slurry of oxide particles (oxides of barium, yttrium and copper) and an organic solvent is spread over a sheet and then flattened with a second sheet. This is then fired at 950° C. for 8 hours in an $O_2$ atm. The transition temperature is approximately 91 K. as measured by both susceptibility and dc measurements. The specimens were approximately $50\mu$ thick with a variety of surface geometries. The ytterbium material was prepared by the oxidation of the metallic precursors of the superconducting oxide.

The only surface area requirement was that sufficient material be present to allow contact of the wires for the dc 4-point technique. A sample holder simultaneously allowed exposure of the specimen to a fluid atmosphere, that is, either liquid or gas, while at the same time maintaining electrical contact through five metal wires. Two outer wires served as current leads, while two inner wires served as voltage probes. A fifth wire was present, but unused. The outer two wires deliver electrical current of a magnitude to be specified, while the inner two measure the voltage across the specimen while this current is passing. This serves as basis for a dc 4-point probe technique which involves passing a current through the specimen while measuring the voltage along a certain specified length of the specimen. In the experiments described herein, the lead wires were made of copper. In practice, a 1.5 volt dry cell battery in series with a calibrated resistor provided a current in the range of 10–100 mA. On the basis of the voltage measurement, the transition temperature from normal to superconducting states was observed in the specimen as manifested by a dramatic change in the electrical resistance.

Example 1

A sample of barium yttrium cuprate was thermally cycled in the following manner. First, the temperature of the sample, in a helium atmosphere, was decreased from room temperature to 85 K. The time for this cooling was approximately 15 minutes. The transition to the superconducting state was observed. The temperature was then raised until the transition to the normal state occurred. This took approximately 5 minutes with an end temperature of approximately 110 K. to assure complete transition. Atmosphere during this part of the thermal cycle was again helium gas. When the specimen temperature reached 110 K., the gas atmosphere was changed to pure oxygen gas, whereupon the temperature was decreased from 110 K. to 85 K. over a period of ~15 minutes. During this time, the atmosphere of the specimen was pure oxygen, which boils at approximately 91 K. under the conditions of this experiment. Thus, at the low end of the temperature interval, the specimen was in fact immersed in liquid oxygen. After the temperature had reached 85 K., it was slowly raised to a value of 110 K. over a course of 1 hour at which time the superconducting-to-normal transition occurred. During this temperature interval, the atmosphere of the specimen was pure oxygen. The thermal cycle from 110 K. to 85 K. in pure oxygen was repeated twice more for a total of 3 full cycles. After this, the temperature of the specimen was decreased from 110 K. to 85 K. in an oxygen atmosphere. After the specimen temperature had reached 85 K., it was maintained at roughly this value.

Then, ozone was generated by energizing a Tesla coil for a period of approximately 10 minutes. Oxygen flowing over the Tesla coil was partially converted to ozone which then found its way into the cell and contacted the oxide sample. The following recipe was used to add ozone to the cell: 10 min., making $O_3$, 10 min. flow just $O_2$, 10 min. making $O_3$. The temperature was then slowly increased from 85 K. to approximately 175 K., taking ~2 hours. During the thermal cycles, the resistance of the specimen was measured continuously by a dc four-point probe technique. Prior to the generation of ozone, the specimen repeatedly demonstrated a dramatic change in resistance at a temperature near 91 K. which is the accepted value for $T_c$ for the barium yttrium cuprate material under investigation. However, after the ozone generation step, the low resistance observed in the superconducting state continued far beyond 91 K. In this particular experiment, the return to the high resistance, normal state was not detected until a temperature of 152 K. had been exceeded.

Example 2

A sample of barium yttrium cuprate was thermally cycled in the following manner. First, the temperature was decreased from room temperature to 85 K. in a helium atmosphere. The time for this was approximately 15 minutes. During this time, the atmosphere was helium gas. After reaching this point, the temperature was increased from 85 K. to certainly above $T_c$, ~110, over a period of 15-20 minutes. Atmosphere during this part of the thermal cycle was again helium gas. When the specimen temperature reached the normal state, the gas atmosphere was changed to that of pure oxygen gas, whereupon the temperature was decreased to 85 K. over a period of 15 minutes. During this time, the atmosphere of the specimen was pure oxygen, which boils at approximately 91 K. under these conditions. Thus, at the low end of the temperature interval, the specimen was in fact immersed in liquid oxygen. After the temperature had reached 85 K., it was slowly raised for a period of ~1 hour to a value of 110 K., or to such a temperature that the normal state was achieved with certainty. During this temperature interval, the atmosphere of the specimen was pure oxygen. The thermal cycle from 110 K. to 85 K. in pure oxygen was repeated twice more for a total of 3 full cycles. After this, the temperature of the specimen, in its normal state, was decreased to 85 K. in an oxygen atmosphere.

After the specimen temperature had reached 85 K., the ozone was generated by energizing a Tesla coil for a period of approximately 2 minutes. Oxygen flowing over the Tesla coil was partially converted to ozone which then found its way to the cell and contacted the oxide sample (during which time, oxygen gas was flowing freely from the ozone generator to the specimen cell). The temperature was then slowly increased from 85 K. to above 217 K. During the thermal cycles, the resistance of the specimen was measured continuously by a dc four-point probe technique. On the basis of the voltage measurement, the transition temperature from normal to superconducting states was observed in the specimen as manifested by a dramatic change in the electrical resistance. Prior to the generation of ozone, the specimen repeatedly demonstrated a dramatic change in resistance at a temperature near 91 K., which is the accepted value for $T_c$ for the barium yttrium cuprate material under investigation. However, after the ozone generation step, the low resistance observed in the superconducting state continued to manifest itself far in excess of 91 K. In this particular experiment, the return to the high resistance normal state was not detected until a temperature of 217 K. had been exceeded.

Example 3

This example treats a totally different sample. The material was a ribbon of a microcomposite of $Ba_2Yb-Cu_3O_7$ and silver. The sample was prepared by a commercial producer of superconducting materials, American Superconductor Corporation of Cambridge, Mass. by the process disclosed and claimed in U.S. Pat. No. 4,826,808, filed May 2, 1989. This sample was thermally cycled in the following manner. First, the temperature was decreased from room temperature to 85 K. The time for this was approximately 15 minutes. During this time, the atmosphere was helium gas. After reaching this point, the temperature was increased from 85 K. to certainly above $T_c$, ~110, over a period of 15-20 minutes. Atmosphere during this part of the thermal cycle was again helium gas. When the specimen temperature reached the normal state, the gas atmosphere was changed to that of pure oxygen gas, whereupon the temperature was decreased to 85 K. over a period of 15 minutes. During this time, the atmosphere of the specimen was pure oxygen, which boils at approximately 91 K. under these conditions. Thus, at the low end of the temperature interval, the specimen was in fact immersed in liquid oxygen. After the temperature had reached 85 K., it was slowly raised for a period of ~1 hour to a value of 110 K., or to such a temperature that the normal state was achieved with certainty. During this temperature interval, the atmosphere of the specimen was pure oxygen. The thermal cycle from 110 K. to 85 K. in pure oxygen was repeated twice more for a total of 3 full cycles. After this, the temperature of the specimen from its normal state was decreased to 85 K. in an oxygen atmosphere. After the specimen temperature had reached 85 K., ozone was generated by energizing a Tesla coil for a period of approximately 2 minutes. Oxygen flowing over the Tesla coil was partially converted to ozone which then found its way to the cell and contacted the oxide sample (during which time, oxygen gas was flowing freely from the ozone generator to the specimen cell). The temperature was then slowly increased from 85 K. to room temperature. During the thermal cycles, the resistance of the specimen was measured continuously by a dc four-point probe technique. On the basis of the voltage measurement, the transition temperature from normal to superconducting states was observed in the specimen as manifested by a dramatic change in the electrical resistance. Prior to the generation of ozone, the specimen repeatedly demonstrated a dramatic change in resistance at a temperature centered at 86.1 K., which is in excellent agreement with the performance of this very specimen as reported to us by the producer, American Superconductor: onset of superconductivity at 88 K. and full zero resistivity at 84 K. However, after the ozone generation step, the low resistance observed in the superconducting state continued to manifest itself far in excess of 91 K. In this particular experiment, the return to the high resistance, normal state was not detected until a temperature of 230 K. had been exceeded.

Example 4

The sample in this example was identical in composition to the samples in Examples 1 and 2. However, the size of this specimen was different. The specimens in Examples 1 and 2 were approximately 50 μm thick. This specimen was almost 2 mm thick. As well, this specimen appeared to be rather dense, while the above cited specimens were somewhat porous. The specimen was subjected to the following thermal cycle. First, the temperature was decreased from room temperature to 85 K. The time for this was approximately 15 minutes. During this time, the atmosphere was helium gas. After reaching this point, the temperature was increased from 85 K. to a value above $T_c$, ~110, over a period of about 10-15 minutes. Atmosphere during this part of the thermal cycle was again helium gas. When the specimen temperature reached 110 K., the gas atmosphere was changed to that of pure oxygen gas, whereupon the temperature was decreased to ~80 K. over a period of 15 minutes. During this time, the atmosphere of the specimen was pure oxygen, which boils at approximately 91 K. under these conditions. Thus, at the low end of the temperature interval, the specimen was in fact immersed in liquid oxygen. After the temperature had reached its minimum value on this part of the thermal cycle, it was increased back to ~110 K. over a period of ~1 hour. During this temperature interval, the atmosphere of the specimen was pure oxygen. The transition to the high resistance state, which by this technique of detection is in fact the normal state, occurred at a temperature of 94 K. The thermal cycle from 110 K. to ~80 K. in pure oxygen was repeated twice more for a total of 3 full cycles. On subsequent heatings, the transition from the superconducting to the normal states occurred at 98 K. and 105 K. After this, the temperature of the specimen from its normal state was decreased to ~80 K. in an oxygen atmosphere. After the specimen temperature had reached ~80 K., ozone was generated by energizing a Tesla coil for a period of 8 minutes and 29 seconds. Oxygen flowing over the Tesla coil was partially converted to ozone which then found its way to the cell and contacted the oxide sample as oxygen gas was flowing freely from the ozone generator to the specimen cell during the entire time the Tesla coil was energized. The temperature was then slowly increased from ~80 K. The transition this time to the normal state occurred at a value almost identical to that measured on the first heating in helium, i.e., ~92 K. For some reason the ozone did not increase the transition temperature. However, the repeated cycling in pure oxygen did increase the transition temperature by not an insignificant amount. The specimen was examined at the completion of the experiment and the current leads had become very resistive in one case to the point of an effective "open circuit" condition. Thus the final results of this experiment are difficult to interpret. It does seem that thermal cycling in pure oxygen may be alone important in raising the transition temperature.

Although the foregoing experiments were conducted with barium yttrium cuprate and barium ytterbium cuprate superconducting oxides, the present technique is, of course, applicable to all superconducting perovskite materials made by any process.

What is claimed is:

1. The method for elevating the critical temperature of a superconducting oxide comprising exposing the oxide while in the superconducting state to an effective amount of ozone for a period of time sufficient to elevate said critical temperature.

2. The method of claim 1 wherein the oxide is thermally cycled into and out of the superconducting state before exposure to ozone.

3. The method of claim 1 wherein the ozone is in the liquid state.

4. The method of claim 1 wherein the ozone is in the gaseous state.

5. The method of claim 1 wherein the ozone is mixed with oxygen.

6. The method of claim 1 further including driving current through the oxide during exposure to ozone.

7. The method of claim 1 wherein the superconducting oxide is barium yttrium cuprate.

8. The method of claim 1 wherein the superconducting oxide is barium ytterbium cuprate.

9. The method of claim 2 including three thermal cycles.

10. The method of claim 3 wherein the oxide is exposed to oxygen during the thermal cycling.

11. The method of claim 5 wherein ozone is mixed with the oxygen for ten minutes followed by the flow of only oxygen followed by ten minutes of an ozone oxygen mixture.

12. The method of claim 5 wherein ozone is mixed with oxygen for approximately two minutes.

13. The method of claim 2 wherein the thermal cycling is conducted in a oxygen atmosphere before exposure to ozone.

14. Method for elevating the critical temperature of a superconducting oxide comprising:
   cooling the oxide to the superconducting state in a helium environment; and
   exposing the oxide to ozone.

15. Method for elevating the critical temperature of a superconducting oxide comprising:
   driving direct current through the oxide;
   cooling the oxide to the superconducting state in a helium environment;
   warming the oxide to the normal state in a helium atmosphere;
   replacing the helium atmosphere with a pure oxygen atmosphere;
   cooling the oxide to the superconducting state;
   warming the oxide in the oxygen atmosphere to the normal state;
   cooling the oxide in an oxygen atmosphere to the superconducting state;
   warming the oxide in an oxygen atmosphere to the normal state;
   cooling the oxide in an oxygen atmosphere to the superconducting state; and
   introducing ozone into the oxygen atmosphere whereby the oxide critical temperature is elevated.

16. Method for elevating the critical temperature of a superconducting oxide comprising thermally cycling the oxide into and out of the superconducting state during exposure to an effective amount of pure oxygen for a period of time sufficient to elevate said critical temperature.

* * * * *

UNITED STATES PATENT AND TRADEMARK OFFICE
CERTIFICATE OF CORRECTION

PATENT NO. : 5,166,131
DATED : November 24, 1992
INVENTOR(S) : Donald R. Sadoway, et al.

It is certified that error appears in the above-indentified patent and that said Letters Patent is hereby corrected as shown below:

Column 3, line 2: delete "filed" and insert therefor -- issued --; and

Column 6, line 13: delete "3" and insert therefor --2 --.

Signed and Sealed this

Nineteenth Day of October, 1993

Attest:

BRUCE LEHMAN

*Attesting Officer*  *Commissioner of Patents and Trademarks*